United States Patent
Brick et al.

(10) Patent No.: US 12,362,336 B2
(45) Date of Patent: Jul. 15, 2025

(54) UNIFORMLY ILLUMINATING RADIATION EMITTING DEVICE AND METHOD OF MANUFACTURE

(71) Applicant: ams-OSRAM International GmbH, Regensburg (DE)

(72) Inventors: Peter Brick, Regensburg (DE); Klaus Flock, Regensburg (DE); Martin Moritz, Regensburg (DE)

(73) Assignee: ams-OSRAM International GmbH, Regensburg (DE)

( * ) Notice: Subject to any disclaimer, the term of this patent is extended or adjusted under 35 U.S.C. 154(b) by 481 days.

(21) Appl. No.: 17/799,292

(22) PCT Filed: Feb. 4, 2021

(86) PCT No.: PCT/EP2021/052634
§ 371 (c)(1),
(2) Date: Aug. 12, 2022

(87) PCT Pub. No.: WO2021/165047
PCT Pub. Date: Aug. 26, 2021

(65) Prior Publication Data
US 2023/0100310 A1    Mar. 30, 2023

(30) Foreign Application Priority Data
Feb. 20, 2020  (DE) ..................... 10 2020 104 522.0

(51) Int. Cl.
*H01L 25/075* (2006.01)
*H10H 20/855* (2025.01)

(52) U.S. Cl.
CPC ....... *H01L 25/0753* (2013.01); *H10H 20/855* (2025.01)

(58) Field of Classification Search
None
See application file for complete search history.

(56) References Cited

U.S. PATENT DOCUMENTS

| 2018/0324343 A1 | 11/2018 | Van Der Sijde et al. |
| 2019/0326482 A1 | 10/2019 | Brick et al. |

(Continued)

FOREIGN PATENT DOCUMENTS

| DE | 10007123 A1 | 9/2001 |
| DE | 102016224090 A1 | 6/2018 |

(Continued)

OTHER PUBLICATIONS

International Search Report issued for the corresponding international patent application No. PCT/EP2021/052634, dated May 14, 2021, 2 pages (for informational purposes only).

(Continued)

*Primary Examiner* — Nduka E Ojeh
(74) *Attorney, Agent, or Firm* — Viering, Jentschura & Partner mbB

(57) ABSTRACT

A radiation emitting device may have a plurality of emitters and a plurality of optical elements. The emitters may be arranged along a first emitter direction at a first average emitter spacing AE1 and along a second emitter direction extending obliquely or perpendicularly to the first emitter direction at a second average emitter spacing AE2. The optical elements may be arranged along a first optics direction at a first average optics spacing AO1 and along a second optics direction extending obliquely or perpendicularly to the first optics direction at a second average optics spacing AO2.

15 Claims, 12 Drawing Sheets

(56) References Cited

U.S. PATENT DOCUMENTS

2020/0194973 A1* 6/2020 Bloemen ............ H01S 5/18388
2020/0355493 A1* 11/2020 Nakamura ................ G06T 1/00
2021/0143611 A1* 5/2021 Jutte .................... H01S 5/4012

FOREIGN PATENT DOCUMENTS

| EP | 3598591 A1 | 1/2020 |
| GB | 2535156 A | 8/2016 |
| JP | 2019071370 A | 5/2019 |
| WO | 2020003660 A1 | 1/2020 |

OTHER PUBLICATIONS

German Search Report issued for the corresponding German patent application No. 10 2020 104 522.0, dated Sep. 23, 2020, 5 pages (for informational purposes only).

\* cited by examiner

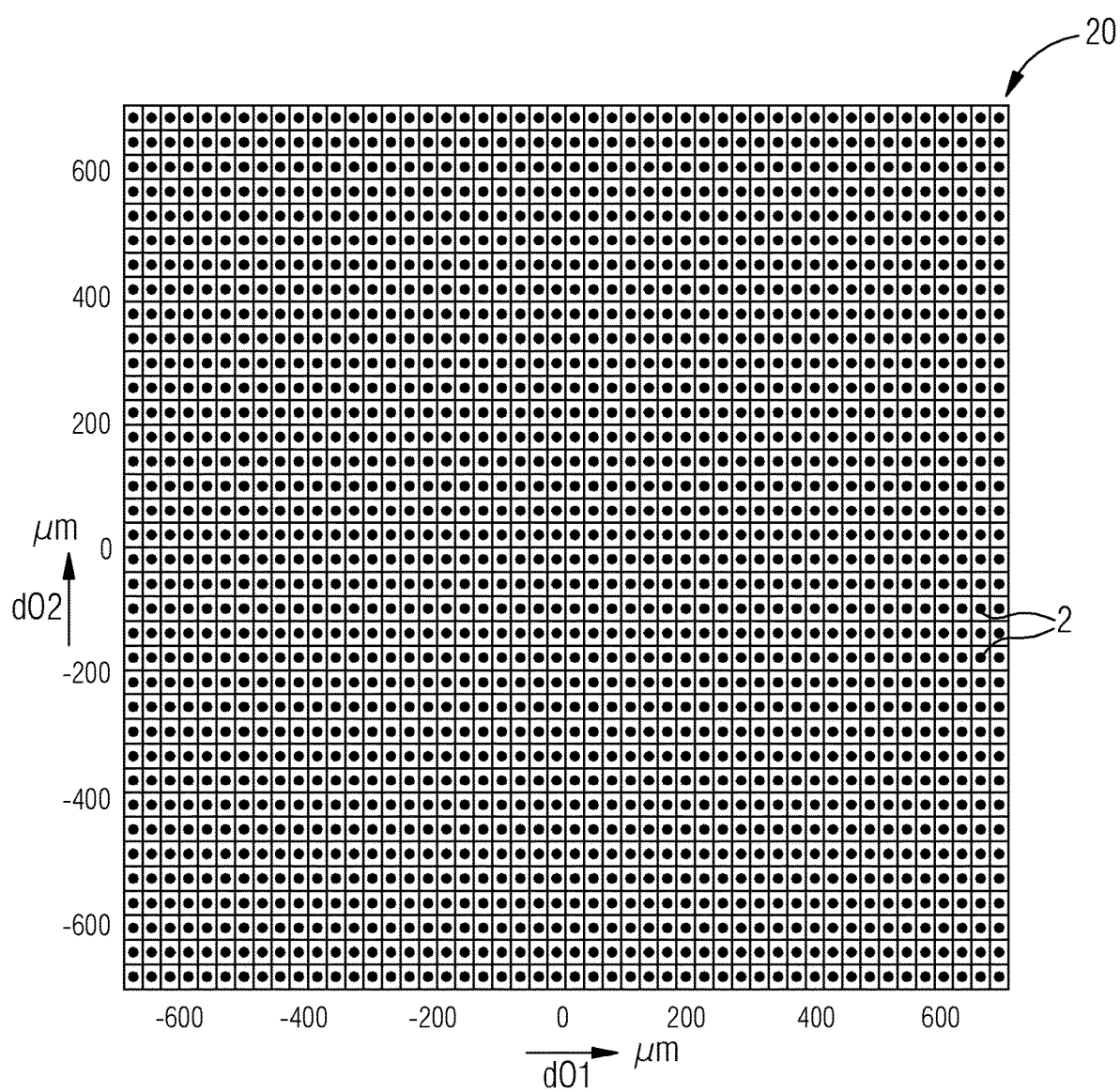

UNIFORMLY ILLUMINATING RADIATION EMITTING DEVICE AND METHOD OF MANUFACTURE

CROSS-REFERENCE TO RELATED APPLICATIONS

The present application is a national stage entry according to 35 U.S.C. § 371 of PCT application No.: PCT/EP2021/052634 filed on Feb. 4, 2021; which claims priority to German Patent application No.: 10 2020 104 522.0, filed on Feb. 20, 2020; all of which are incorporated herein by reference in their entirety and for all purposes.

TECHNICAL FIELD

The present patent application relates to a radiation emitting device and a method for producing a radiation emitting device.

BACKGROUND

For various applications, for example in sensor technology, target areas need to be homogeneously illuminated. For this purpose, modules with several emitters with an associated lens array may find application. However, interference or diffraction effects can lead to an inhomogeneous illumination of the target area.

It is an objective to achieve a homogeneous illumination in a simplified way.

SUMMARY

A radiation emitting device is specified with a plurality of emitters and a plurality of optical elements.

The optical elements are expediently disposed downstream of the emitters in a main radiation direction of the emitters, such that the optical elements shape the radiation emitted by the emitters. For example, the emitters and the optical elements are arranged in two planes parallel to each other.

The emitters may be arranged in an emitter array. The optical elements may be arranged in an optics array.

According to at least one embodiment of the radiation emitting device, the emitters are arranged along a first emitter direction at a first average emitter spacing AE1. The distance here refers to the center-to-center distance between adjacent emitters. The average emitter spacing is the averaged center-to-center spacing at which the emitters are located along the first emitter direction. The emitters may be arranged regularly so that the emitter spacing between adjacent emitters is the same in each case. The first emitter direction is oblique or perpendicular to the main radiation direction of the emitters, such as perpendicular to the main radiation direction.

According to at least one embodiment of the radiation emitting device, the emitters are arranged along a second emitter direction extending obliquely or perpendicularly to the first emitter direction at a second average emitter spacing AE2. Along the second emitter direction, the emitters may be arranged regularly. The second emitter direction extends obliquely or perpendicularly to the main radiation direction of the emitters, such as perpendicularly to the main radiation direction. For example, the first emitter direction and the second emitter direction span an emitter array in which the emitters are arranged, in particular in a common emitter plane.

For example, the number of emitters along the first emitter direction and/or along the second emitter direction is at least 5 or at least 10.

According to at least one embodiment of the radiation emitting device, the optical elements are arranged along a first optics direction at a first average optics spacing AO1. Here, the optics spacing refers to the center-to-center spacing between two adjacent optical elements. The optical elements may, but need not necessarily, be arranged regularly along the first optics direction.

According to at least one embodiment of the radiation emitting device, the optical elements are arranged along a second optics spacing AO2 that is oblique or perpendicular to the first optics direction. The optical elements may, but need not necessarily, be arranged regularly along the second optics direction.

For example, the first optics direction and the second optics direction span an optics array in which the optical elements are arranged, in particular in a common optics plane.

For example, the number of optical elements along the first optics direction and/or along the second optics direction is at least 5 or at least 10.

Expediently, the number of optical elements along the first optics direction is different from the number of emitters along the first emitter direction and/or the number of optical elements along the second optics direction is different from the number of emitters along the second emitter direction.

The optics array and the emitter array may extend parallel or at least substantially parallel to each other, approximately with a deviation of at most 10°.

The optical elements are, for example, lenses, in particular microlenses. For example, a lateral extent of the individual optical elements, i.e. an extent along the optics array, is at most 100 µm or at most 80 µm and/or at least 10 µm or at least 20 mm. The lateral extent refers here to the maximum extent, such as the diameter for the case of an optical element with a circular base surface relative to the optical plane.

According to at least one embodiment of the radiation emitting device, the first emitter direction and the first optics direction are arranged at an angle $\Phi$ to each other. The angle between the second emitter direction and the second optics direction may be equal to or different from the angle $\Phi$.

For angle $\Phi=0$, the first emitter direction and the first optics direction are parallel to each other.

According to at least one embodiment of the radiation emitting device, the condition applies (i) $NE1*AE1*\cos \Phi = m2*AO1$.

Here NE1 is the number of emitters along the first emitter direction and m2 is a factor. Thus, this condition establishes a link between the average spacing of the emitters AE1 along the first emitter direction and the average spacing AO1 of the optical elements along the first optics direction. In particular, a projection of the product of the number of emitters NE1 along the first emitter direction and average distance AE1 along this direction is made onto the first optics direction. This product corresponds here to the lateral extension of the emitter array along the first emitter direction. For the special case $\Phi=0$, i.e. the coincidence of the first emitter direction and the first optics direction, the simplified relation $NE1*AE1=m2*AO1$ is thus obtained.

According to at least one embodiment of the radiation emitting device, the condition applies:

(ii) $NE2*AE2*\sin \Phi = m4*AO1$.

Here, NE2 is the number of emitters along the second emitter direction and m4 is a factor. For the special case Φ=0, m4=0 is obtained.

According to at least one embodiment of the radiation emitting device, the condition applies:

(iii) NE1*AE1*sin Φ=m1*AO2.

For the special case Φ=0, m1=0 is obtained.

According to at least one embodiment of the radiation emitting device, the condition applies:

(iv) NE2*AE2*cos Φ=m3*AO2.

Here m3 is again a factor. Thus, this condition establishes a link between the average spacing of the emitters AE2 along the second emitter direction and the average spacing AO2 of the optical elements along the second optics direction. In particular, a projection of the product of the number of emitters NE2 along the second emitter direction and average spacing AE2 along this direction is made onto the second optics direction. This product corresponds here to the lateral extension of the emitter array along the first emitter direction. For the special case Φ=0, the simplified relation NE2*AE2=m3*AO2 applies.

In at least one embodiment of the radiation emitting device, the radiation emitting device comprises a plurality of emitters and a plurality of optical elements, wherein the emitters are arranged along a first emitter direction at a first average emitter spacing AE1 and along a second emitter direction extending obliquely or perpendicularly to the first emitter direction at a second average emitter spacing AE2. The optical elements are arranged along a first optics direction at a first average optics spacing AO1 and along a second optics direction extending obliquely or perpendicularly to the first optics direction at a second average optics spacing AO2, and at least one of the following four conditions is satisfied:

(i) $NE1 * AE1 * \cos \Phi = m2 * AO1$, (ii) $NE2 * AE2 * \sin \Phi = m4 * AO1$, (iii) $NE1 * AE1 * \sin \Phi = m1 * AO2$, (iv) $NE2 * AE2 * \cos \Phi = m3 * AO2$, wherein NE1 is the number of emitters along the first emitter direction, NE2 is the number of emitters along the second emitter direction, Φ is an angle between the first emitter direction and the first optics direction, and m1, m2, m3, and m4 are factors, respectively.

In an embodiment, the average emitter spacing AE1 is different from the first average optics spacing AO1. In an embodiment, the second average emitter spacing AE2 is different from the second average optics spacing AO2. In case of doubt, the optics direction which comprises the smaller angle to the first emitter direction can be considered as the first optics direction.

By satisfying at least one of the four mentioned conditions (i) to (iv), an arrangement of emitters and optical elements can be obtained in which the risk of inhomogeneities in the illumination of a target object is reduced. It has been shown that unintended patterns in the illumination due to interference effects can be effectively suppressed.

Furthermore, by means of the conditions, a systematic, i.e., non-random or pseudo-random, relative arrangement of emitters and optical elements along one or more directions can be achieved without repeating the relative arrangements between individual emitters and associated optical elements along the respective optical directions. Compared to random or pseudo-random arrangements, the homogeneity of the illumination is also increased.

According to at least one embodiment of the radiation emitting device, at least two of the conditions (i) to (iv) are fulfilled. In particular, all four conditions may also be fulfilled simultaneously.

According to at least one embodiment of the radiation emitting device, the factors m1, m2, m3, and m4 each differ by at most a deviation fraction from a nearest integer, wherein an absolute value of the deviation fraction is between 0 and 0.05, inclusive. In other words, the factors m1 to m4 are each at most 0.05 smaller or larger than the nearest integer. In an embodiment, the deviation fraction is equal to 0. Thus, in this case, the integer closest to the respective factor is equal to the factor.

According to at least one embodiment of the radiation emitting device, at least one of the following conditions is satisfied:

(v) the integer closest to the factor m2 is co-prime to NE1;

(vi) the integer closest to the factor m4 is co-prime to NE2;

(vii) the integer closest to the factor m1 is co-prime to NE2;

(viii) the integer closest to the factor m3 is co-prime to NE1.

Here, co-prime means that the numbers concerned, for example m2 and NE1, do not comprise a common prime factor. In this way, it can be avoided in a simplified manner that the relative arrangement of the emitters to the optical elements illuminated by the emitters is repeated along the first optics direction and/or the second optics direction within the radiation emitting device. In particular, the relative arrangement of the emitters to the associated optical emitters within the radiation emitting device does not repeat even when the emitters and the optical elements are arranged regularly along that direction.

In particular, at least two, for example three, or even all four of conditions (v) to (viii) may be satisfied.

According to at least one embodiment of the radiation emitting device, NE1 and/or NE2 are prime numbers. This ensures, in a simplified manner, that NE1 is prime to m2 and m3 as long as m2 and m3 are not integer multiples of NE1. Similarly, NE2 is co-prime to m4 and m1 as long as m1 and m4 are not integer multiples of NE2.

According to at least one embodiment of the radiation emitting device, NE1=NE2. Thus, the number of emitters along the first emitter direction is equal to the number of emitters along the second emitter direction.

According to at least one embodiment of the radiation emitting device, Φ=0°. Consequently, the first emitter direction and the first optics direction are parallel to each other.

According to at least one embodiment of the radiation emitting device, the emitters are arranged in a rectangular lattice. Thus, the first emitter direction and the second emitter direction are perpendicular to each other.

According to at least one embodiment of the radiation emitting device, the emitters are arranged in a hexagonal lattice. The hexagonal lattice may be a regular hexagonal lattice or a hexagonal lattice compressed or stretched along a direction.

According to at least one embodiment of the radiation emitting device, the spacing of adjacent emitters along the first emitter direction differs from the first average emitter spacing by at most 20% or by at most 108. This may apply analogously to the spacing of adjacent emitters along the second emitter direction. In an embodiment, the distances of adjacent emitters along an emitter direction are equal in each case.

According to at least one embodiment of the radiation emitting device, the emitters are surface emitting semiconductor lasers or light emitting diodes. For example, the main radiation direction of the emitters is in each case perpendicular to the emitter plane in which the emitters are arranged side by side. For example, the emitters are vertical cavity surface emitting semiconductor lasers, abbreviated VCSEL for Vertical Cavity Surface Emitting Laser. The individual emitters can be integrated into a common semiconductor component, in particular monolithically integrated into a common semiconductor body. As a result, particularly small emitter spacings can be achieved, in particular particularly small interspaces between adjacent emitters.

According to at least one embodiment of the radiation emitting device, the optical elements are arranged in a contiguous optics assembly. The optical elements are therefore not individual elements spaced apart from one another, but sub-regions of a common optical assembly. This simplifies the producing of the radiation emitting device and the positioning of the optical elements relative to the emitters.

Furthermore, a method for producing a radiation emitting device is specified. The method is particularly suitable for producing the radiation emitting device described above.

Features cited in connection with the radiation emitting device can therefore also be used for the method, and vice versa.

In at least one embodiment of the method for producing a radiation emitting device with a plurality of emitters and a plurality of optical elements, the method comprises the steps of:
(a) determining an assembly with a number and a position of the emitters and the optical elements such that
the emitters are arranged along a first emitter direction at a first average emitter spacing AE1 and along a second emitter direction extending obliquely or perpendicularly to the first emitter direction at a second average emitter spacing AE2
said optical elements are arranged along a first optics direction (dO1) at a first average optics spacing AO1 and along a second optics direction (dO2) extending obliquely or perpendicularly to said first optics direction at a second average optics spacing AO2; and
at least one of the following four conditions is satisfied:

(i) $NE1 * AE1 * \cos \Phi = m2 * AO1$, (ii) $NE2 * AE2 * \sin \Phi = m4 * AO1$, (iii) $NE1 * AE1 * \sin \Phi = m1 * AO2$, (iv) $NE2 * AE2 * \cos \Phi = m3 * AO2$, wherein NE1 is the number of emitters along the first emitter direction, NE2 is the number of emitters along the second emitter direction, $\Phi$ is an angle between the first emitter direction and the first optics direction, and m1, m2, m3, and m4 are factors, respectively; and
(b) forming the radiation emitting device according to the determined structure.

Thus, in producing the radiation emitting device, the arrangement of the emitters and the optical elements are specifically matched to each other so that an improved homogeneity in the illumination of a target object is achievable.

The first average optics spacing and the first average emitter spacing and the number of optical elements and emitters along the first optics direction and the first emitter direction, respectively, are different from each other in this case in particular, so that there is no 1:1 assignment between optical elements and emitters along these directions.

BRIEF DESCRIPTION OF THE DRAWINGS

Further embodiments and expediencies will become apparent from the following description of the exemplary embodiments in connection with the figures.

In the Figures:

FIGS. 3A to 3C show a reference example with emitter positions in FIG. 3A, positions of optical elements in FIG. 3B and the corresponding folded back emitter positions in FIG. 3C;

In each case, the figures are schematic illustrations and therefore not to scale unless explicitly specified otherwise.

Identical, similar or similarly acting elements are provided in the figures with the same reference signs.

DETAILED DESCRIPTION

Figure 1:
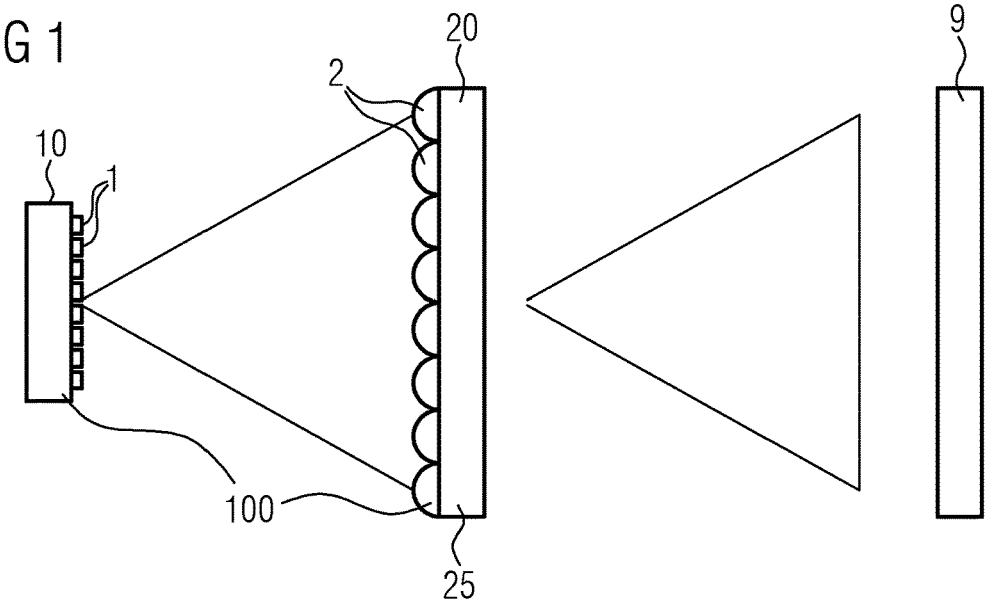
FIG. 1 shows a schematic illustration of a radiation emitting device.

In FIG. 1, the radiation emitting device 100 is shown in a highly simplified schematic illustration. The radiation emitting device comprises a plurality of emitters 1. The emitters are arranged in an emitter array 10, for example in the form of individually controllable emitters which are monolithically integrated in a semiconductor body as VCSELS or light-emitting diodes. Deviating from this, however, the individual emitters can also be separate individually controllable devices. The number of emitters 1 can be varied within wide limits, in particular depending on the illumination of a target object 9 to be achieved. For example, the radiation emitting device 100 comprises between 50 and 10000 emitters inclusive.

The radiation emitting device 100 further comprises a plurality of optical elements 2, for example as an optics array 20 in the form of an optics assembly 25. The number of optical elements 2 is in particular different from the number of emitters. That is, the emitters 1 are not assigned exactly one optical element 2 in a 1:1 relationship.

Figure 2A:
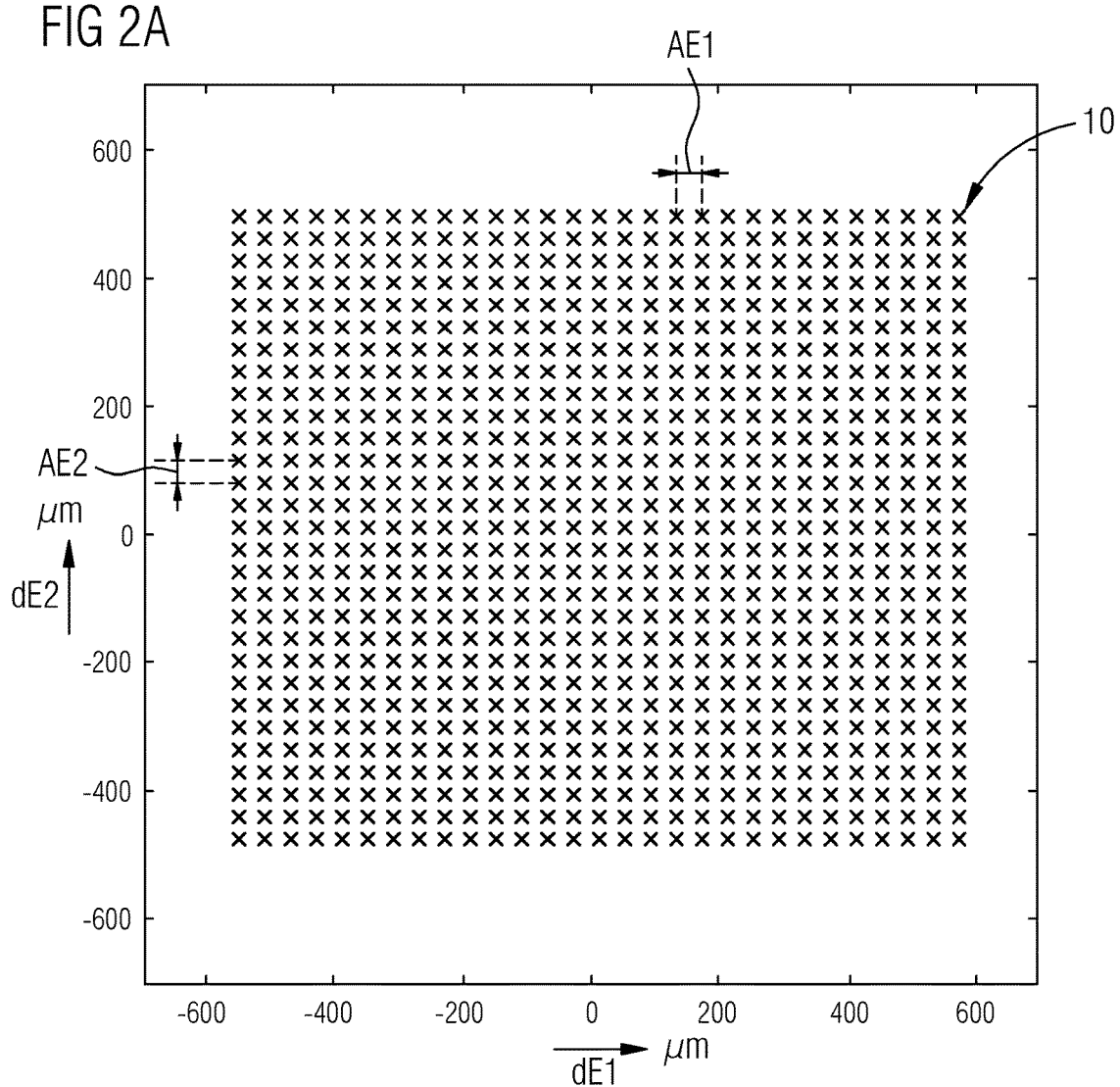
FIG. 2A shows an illustration of emitter positions in plan view.
Figure 2B:
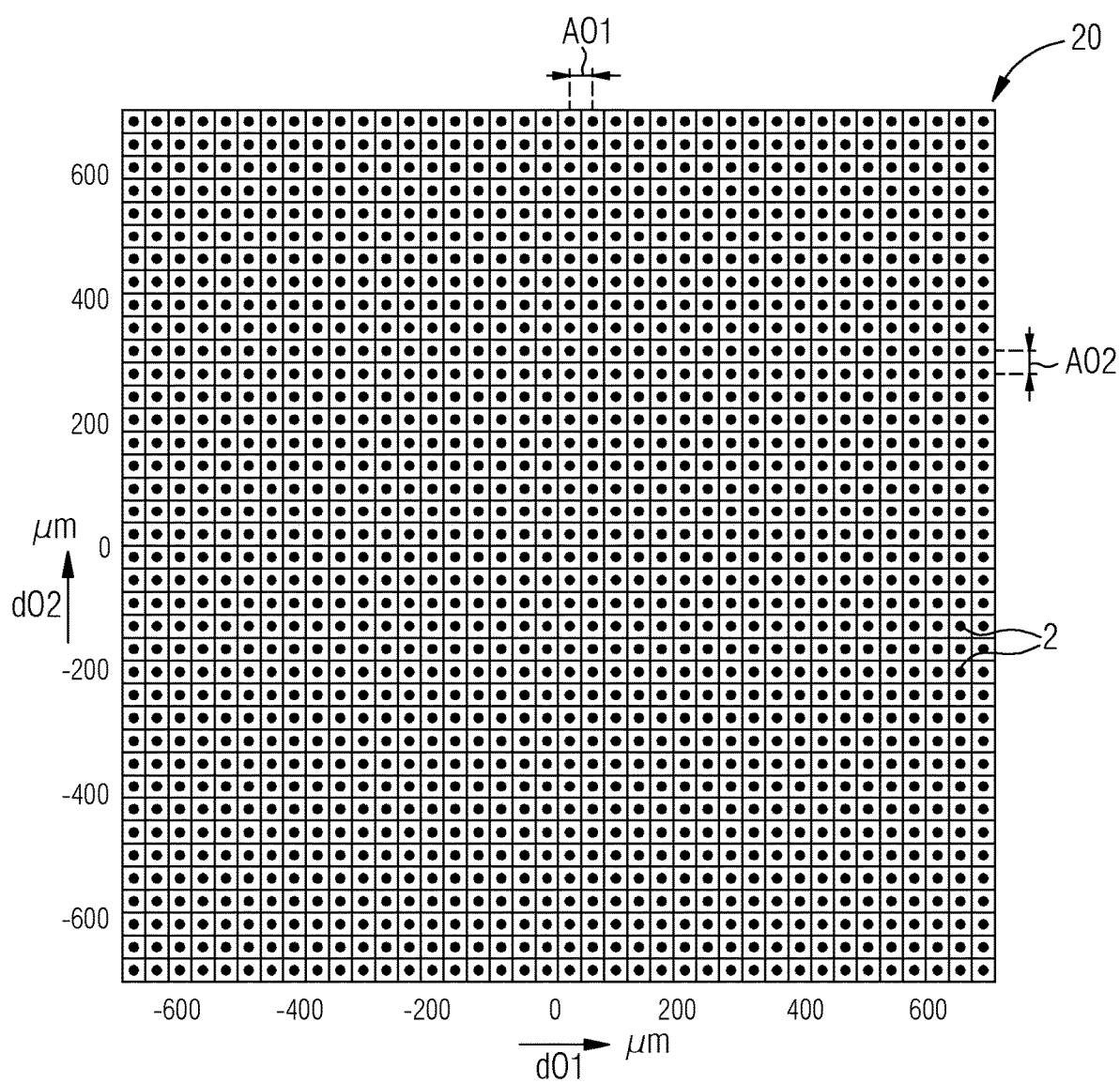
FIG. 2B shows an associated illustration of the positions of the optical elements.
Figure 2C:
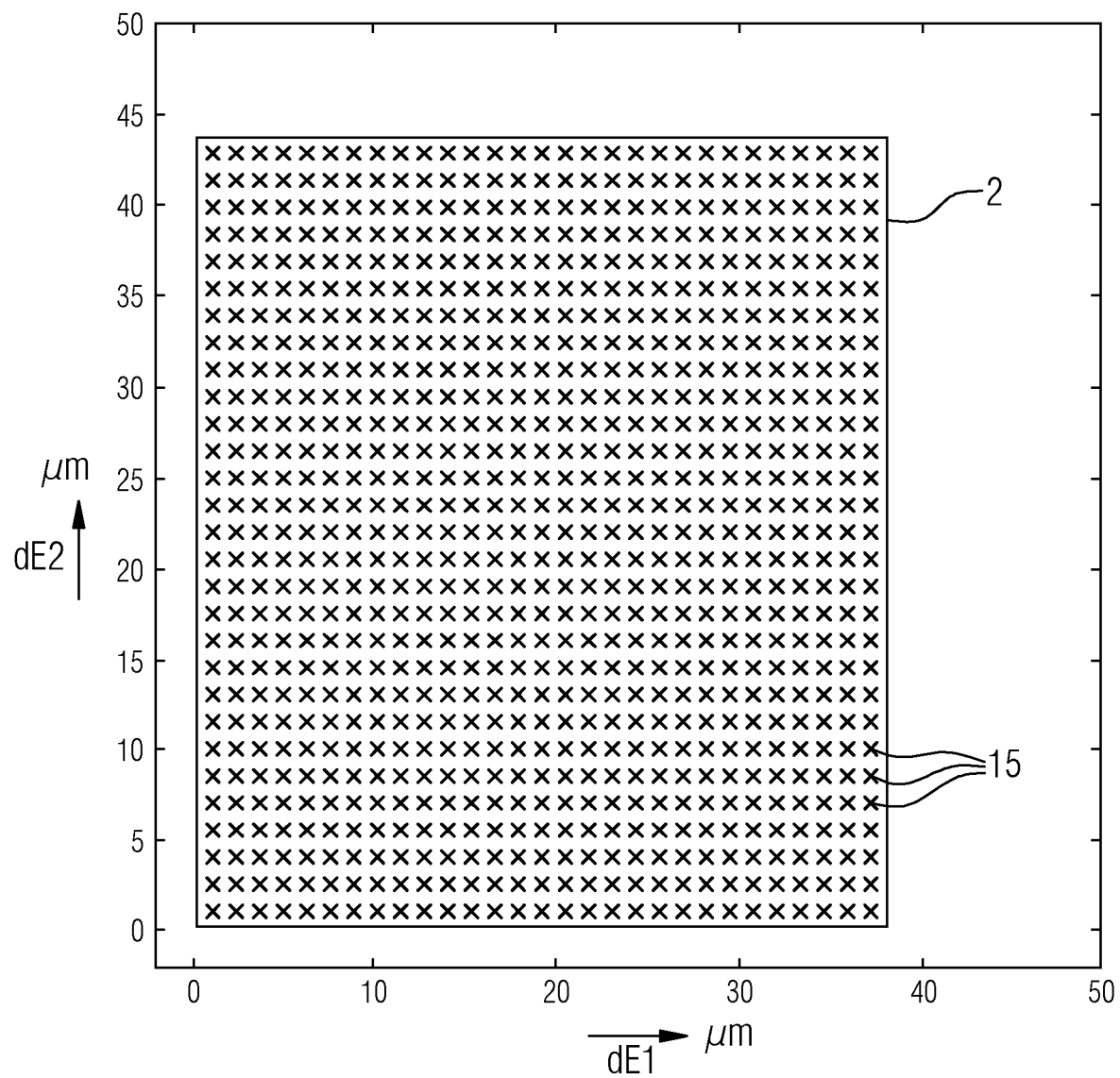
FIG. 2C shows an associated illustration of emitter positions folded back onto an optical element.

FIGS. 2A to 2C illustrate a specific example in which along a first emitter direction dE1 29 emitters and along a second emitter direction dE2 29 emitters are arranged in matrix form in an emitter array. The first emitter direction dE1 and the second emitter direction dE2 are perpendicular to each other, so that the emitters are arranged in a regular rectangular lattice. Along the first emitter direction dE1, the emitters are arranged at a first average emitter spacing AE1 of 40 µm. The lateral extent of the emitter array 10 along the first emitter direction dE1 results from the product of the first average emitter spacing AE1 and the number of emitters along this direction, i.e. 29. Along the second emitter direction dE2, the emitters 2 are arranged at a second average emitter spacing AE2 of 34.64 µm. The lateral extent along the second emitter direction results from the product of the second average emitter spacing AE2 and the number of emitters along this direction, i.e. 29.

Of course, the second average emitter spacing AE2 can also be greater than or equal to the first average emitter spacing AE1, deviating from the example shown.

The optical elements 2 shown in FIG. 2B are arranged along a first optics direction dO1 at a first average optics spacing AO1 of 37.42 µm. Along a second optics direction dO2 the optical elements 2 are arranged at a second optics spacing AO2 of 43.68 µm. The dots represent the centers of the optical elements 2, respectively.

The first emitter direction dE1 and the first optics direction dO1 coincide, so the angle between these directions is $\Phi=0$.

This gives for the above condition (i) NE1*AE1=31*dO1 as well as for the relation (iv) NE2*AE2=23*dO2. Thus, the numbers m2=31 and NE1=29 are co-prime to each other. Correspondingly, the numbers m3=23 and NE2=29 are also co-prime from each other.

In this exemplary embodiment, the same number of emitters is arranged along the first emitter direction dE1 and along the second emitter direction dE2, but this is not required.

The number of emitters along an emitter direction is a prime number. The factors m2 and m3 are integers in each case. Integers, in particular numbers which are co-prime to the respective number of emitters along the associated direction have proved to be particularly favorable. However, a small positive or negative deviation of the factors from integers is also possible, such as with a deviation fraction of at most 0.05. For example, 30.95≤m2≤31.05 may apply.

In FIG. 2C, the emitter positions 15 folded back into an optical element 2 are illustrated. The folded-back emitter positions 15 can be determined by means of a difference of the absolute emitter positions according to FIG. 2A to the next smaller integer multiple of the respective average optics spacing. It can be seen from FIG. 2C that the folded-back emitter positions 15 are uniformly distributed over the optical element. This has the consequence that the illumination of a target object 9 can also be particularly homogeneous. Relative relationships between the optical elements 2 and to the associated emitters 1 repeating over the optical array 20 would, on the other hand, manifest themselves in cluster points in the folded-back illustration.

Figure 3A:
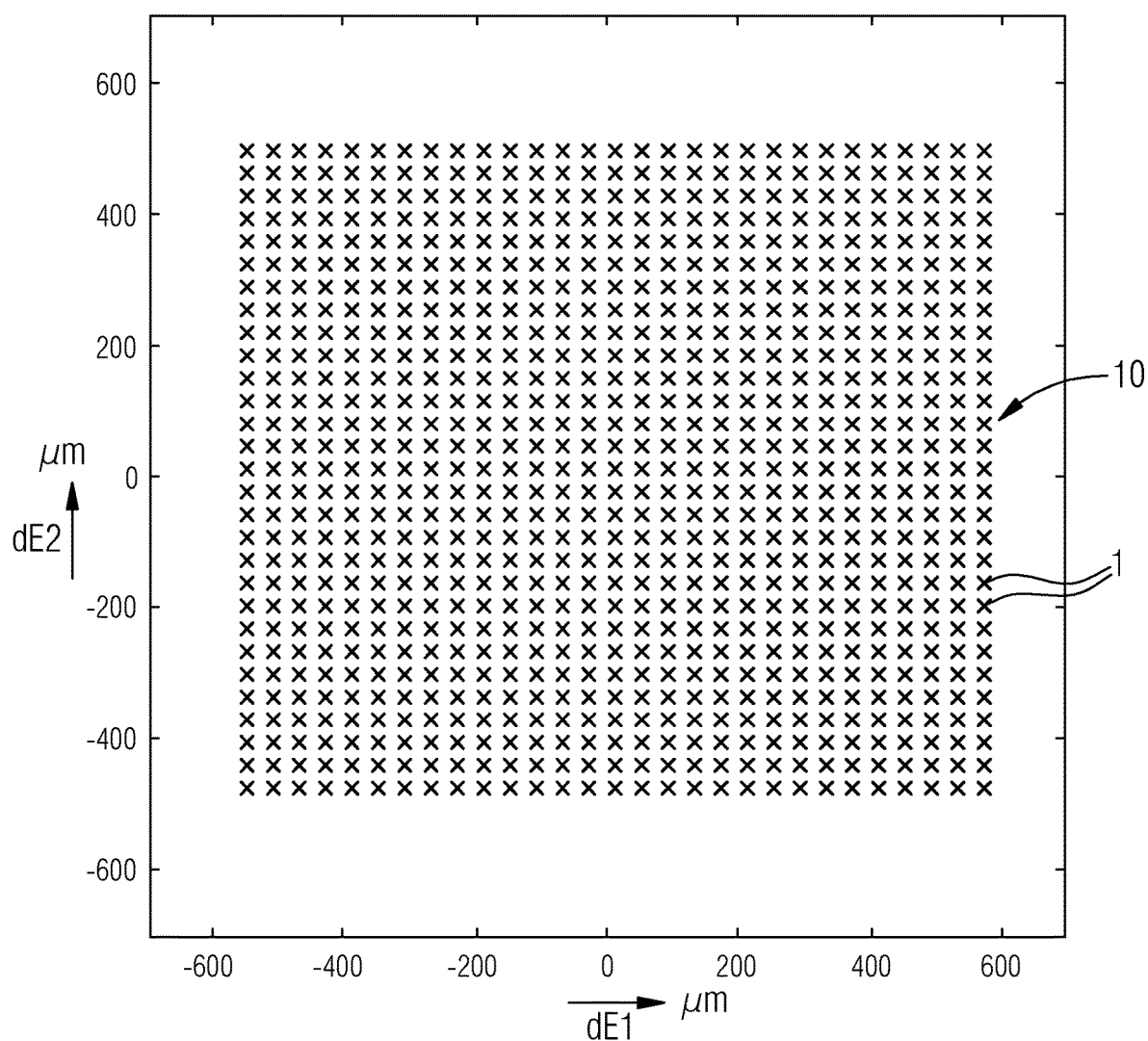
Figure 3C:
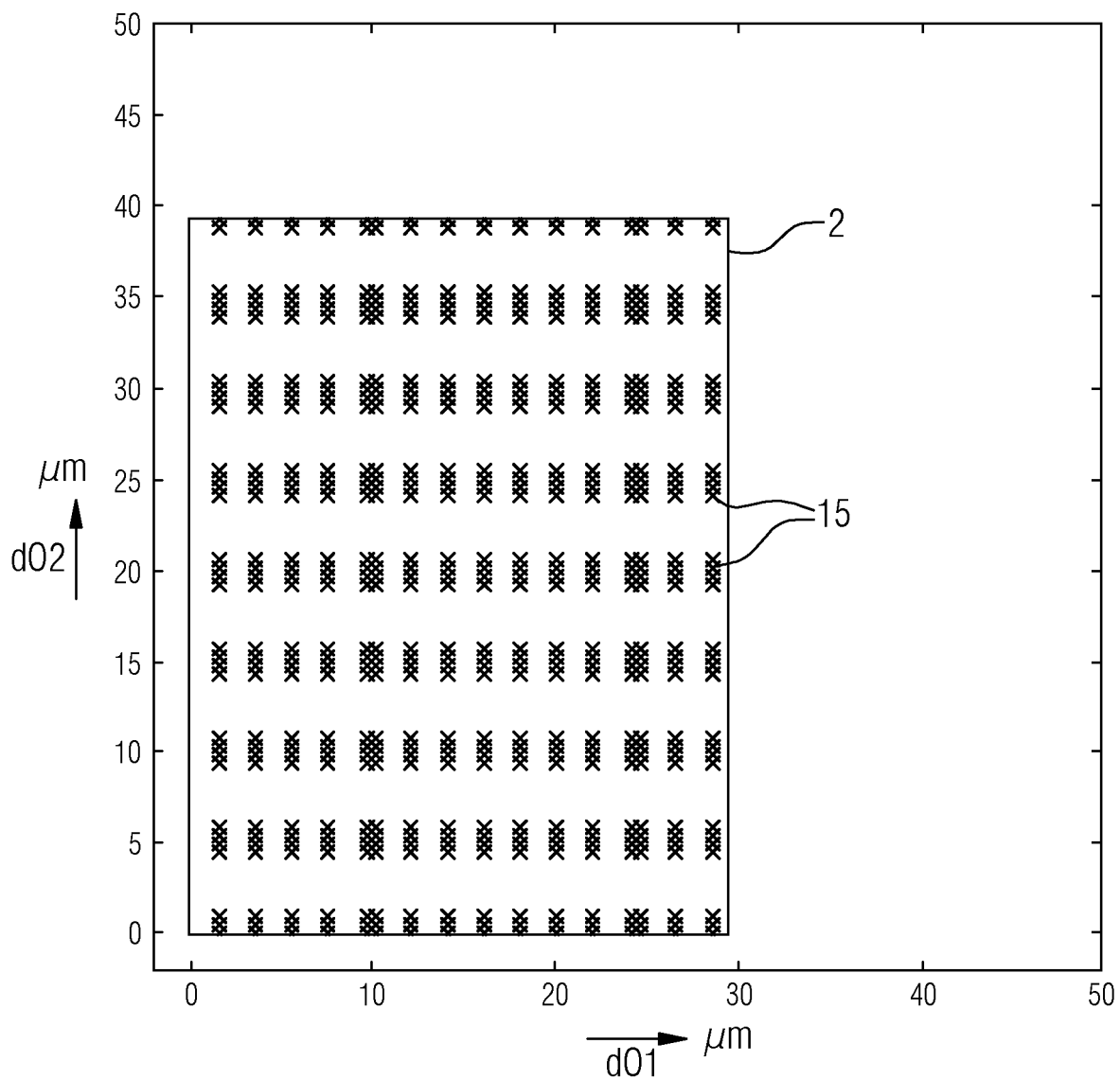

As a reference example, FIGS. 3A to 3C illustrate a variant in which the number of emitters along the first emitter direction and along the second emitter direction, as well as the spacing along these directions, are the same as in the exemplary embodiment illustrated in FIGS. 2A to 2C. In contrast, the first average optics spacing AO1=29.5 µm and the second average optics spacing AO2=39.5 µm. This results in a value of 29.3 for the factor m2 and a value of 25.4 for the factor m3. The factors m2 and m3 thus differ by 0.3 and 0.4, respectively, from the nearest integer.

Thus, these values differ significantly from the nearest natural number in each case. From the folded-back emitter positions 15 of FIG. 3C, it is clear that these are not homogeneously distributed over the optical element 2. This leads to an inhomogeneous illumination of a target object 9.

Figure 4A:
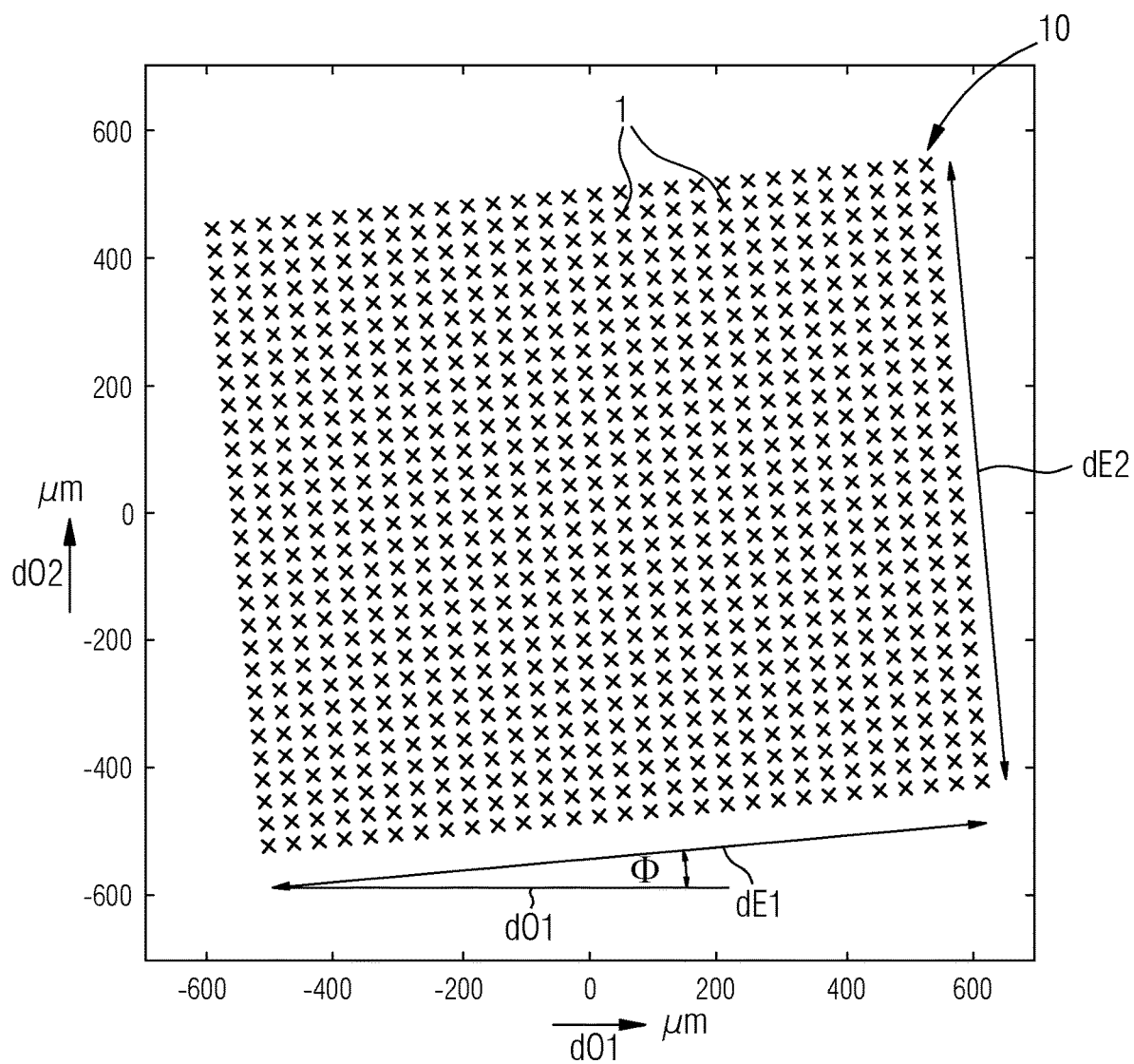
FIG. 4A shows an illustration of emitter positions in plan view.
Figure 4B:
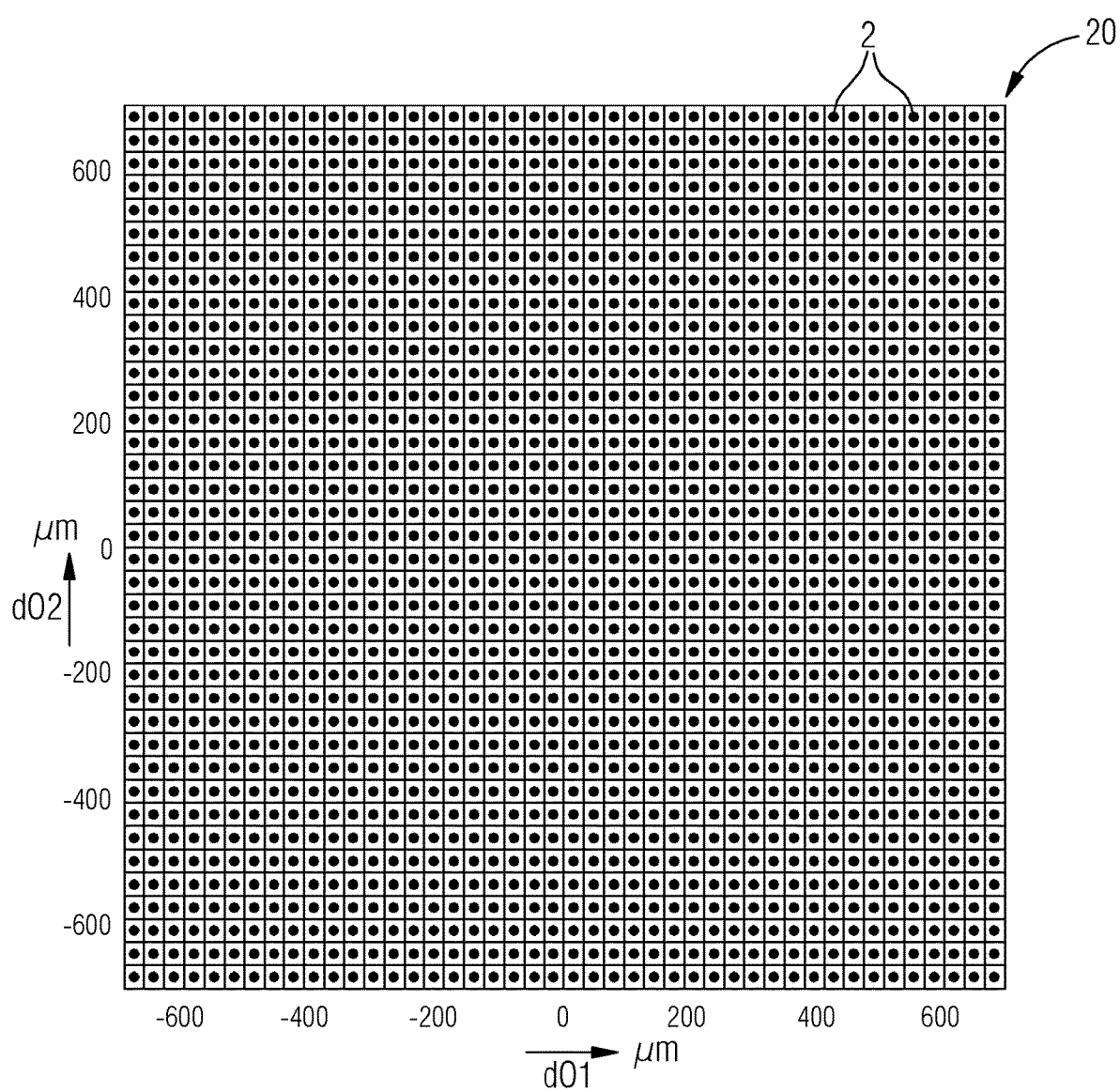
FIG. 4B shows an associated illustration of optical element positions.
Figure 4C:
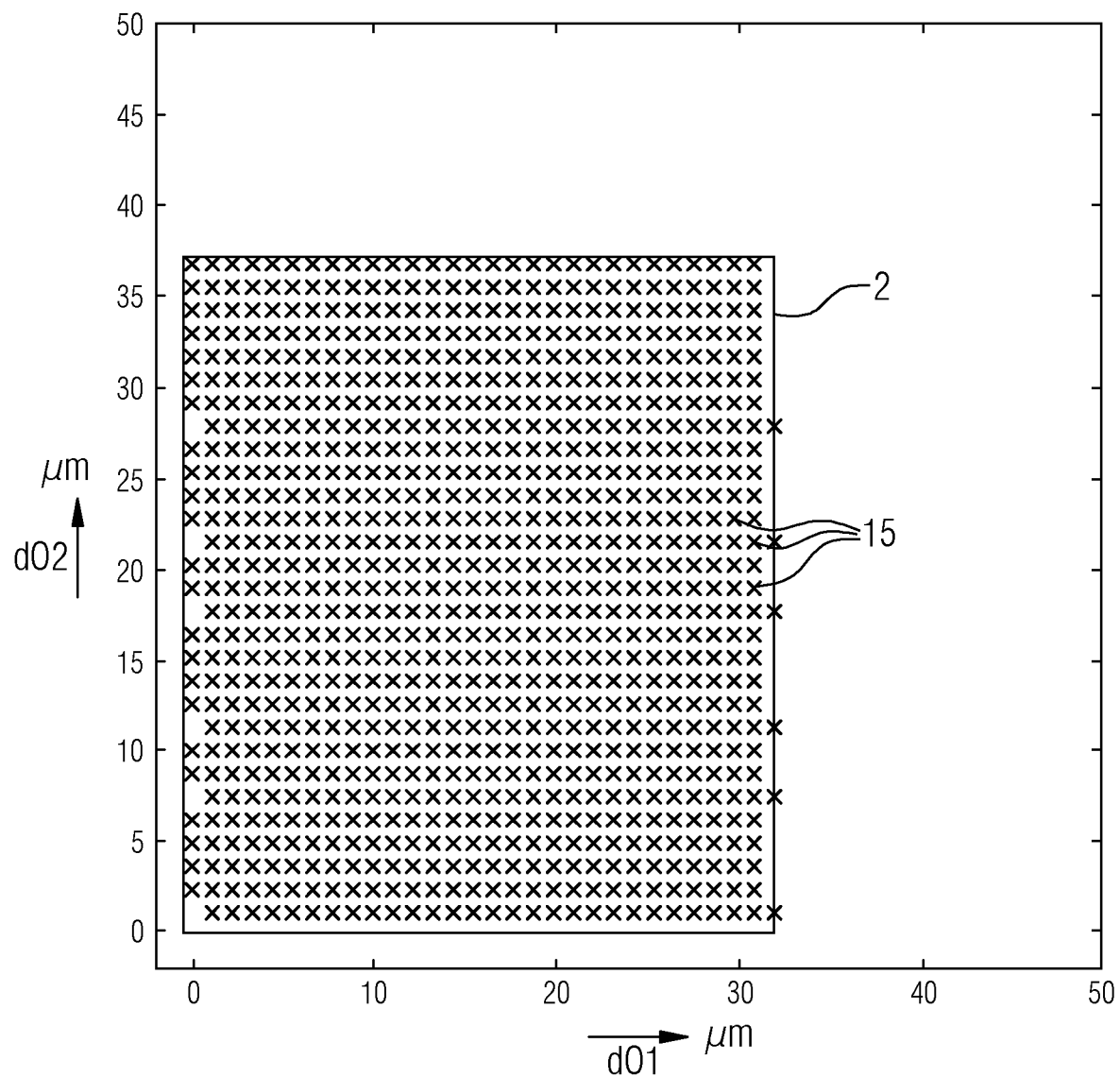
FIG. 4C shows an associated illustration of emitter positions folded back onto an optical element.

In the exemplary embodiment shown in FIGS. 4A to 4C, the more general case is shown that the emitters 1 and the optical elements 2 are each arranged in a regular grating, wherein, however, the gratings are rotated by an angle $\Phi$ with respect to each other. Exemplarily, an angle $\Phi$ between the first emitter direction dE1 and the second optics direction dO1 is 5.5°. The same angle is also obtained between the second emitter direction dE2 and the second optics direction dO2.

The number of emitters 1 and the distances between the emitters 1 along the first and second emitter directions are respectively as described in connection with FIGS. 2A to 2C.

A value of 32.07 µm was selected for the first average optics spacing AO1, and a value of 37.04 was selected for the second optics spacing AO2. Accordingly, the relationships are (i) $NE1 * AE1 * \cos \Phi = 36 * AO1$, (ii) $NE2 * AE2 * \sin \Phi = 3 * AO1$, (iii) $NE1 * AE1 * \sin \Phi = 3 * AO2$ und (iv) $NE2 * AE2 * \cos \Phi = 27 * AO2$.

Consequently, the obtained factors m1=3, m2=36, m3=27, and m4=3 are, respectively, natural numbers that are co-prime to the number of emitters along the two emitter directions. FIG. 4C again illustrates the folded-back emitter positions 15 into an optical element 2. A homogeneous arrangement of these fold-back emitter positions 15 is obtained.

Figure 5A:
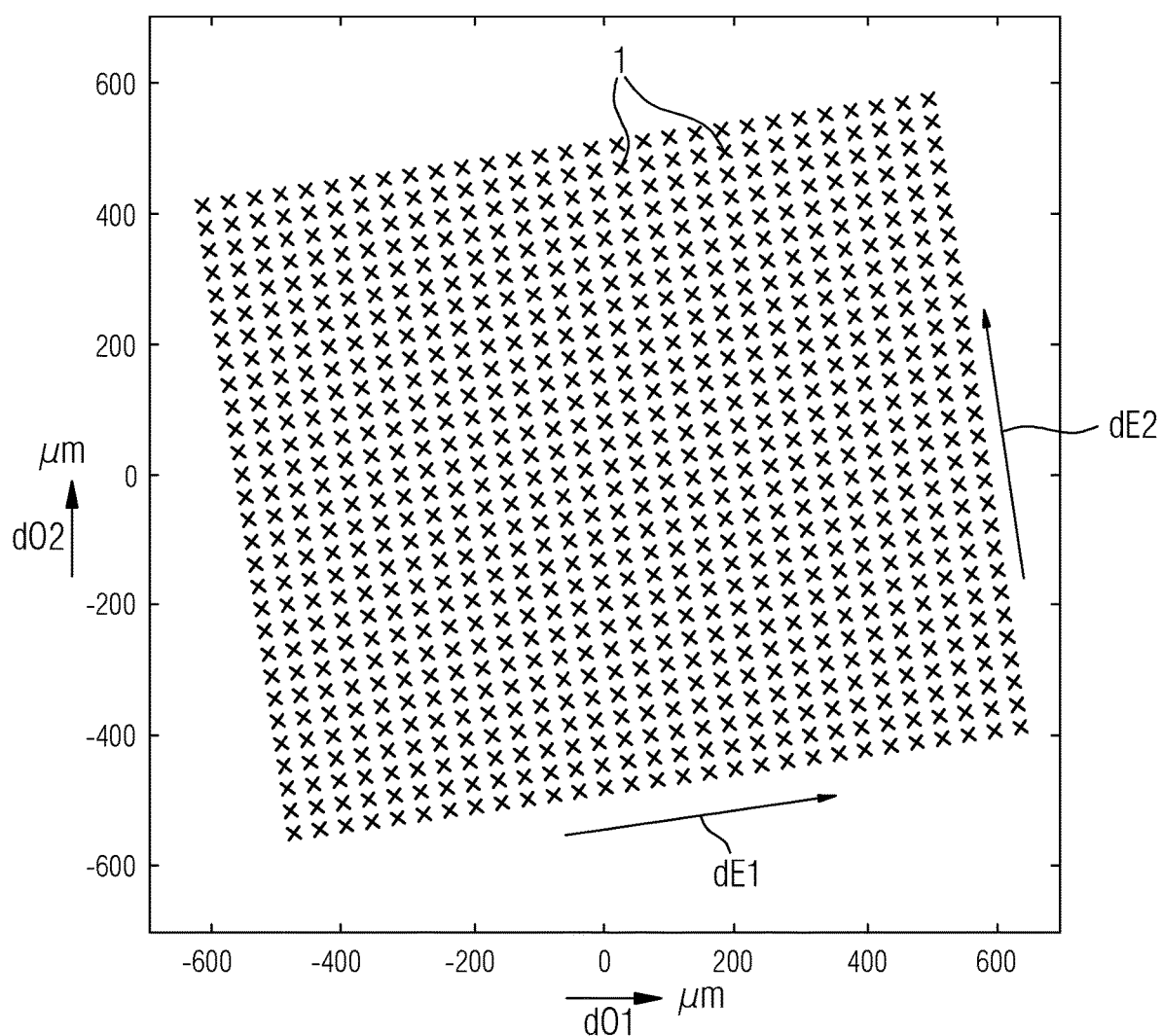
FIGS. 5A to 5C show a reference example with emitter positions in FIG. 5A, optical element positions in FIG. 5B, and the corresponding folded-back emitter positions in FIG. 5C.
Figure 5B:
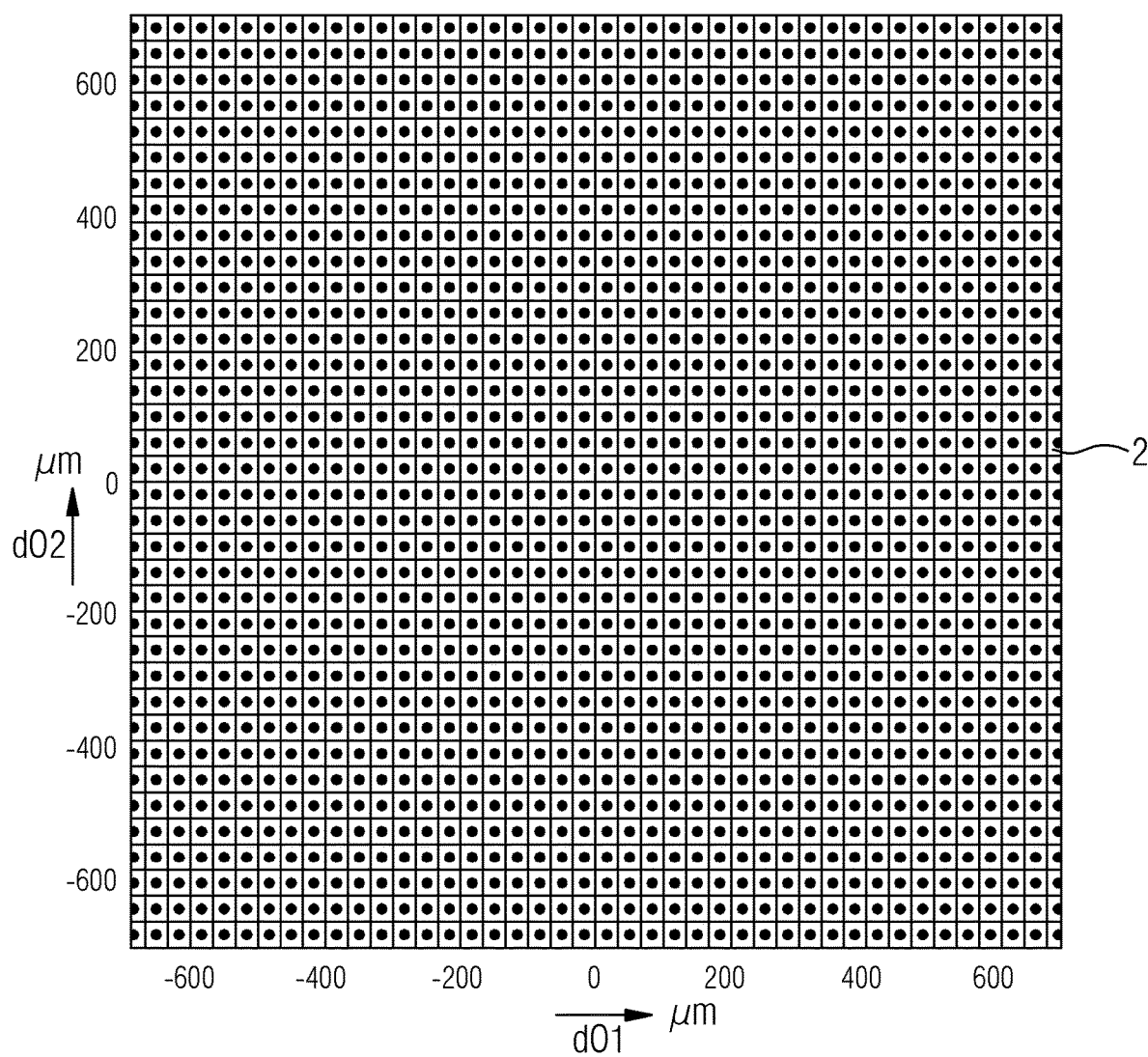
Figure 5C:
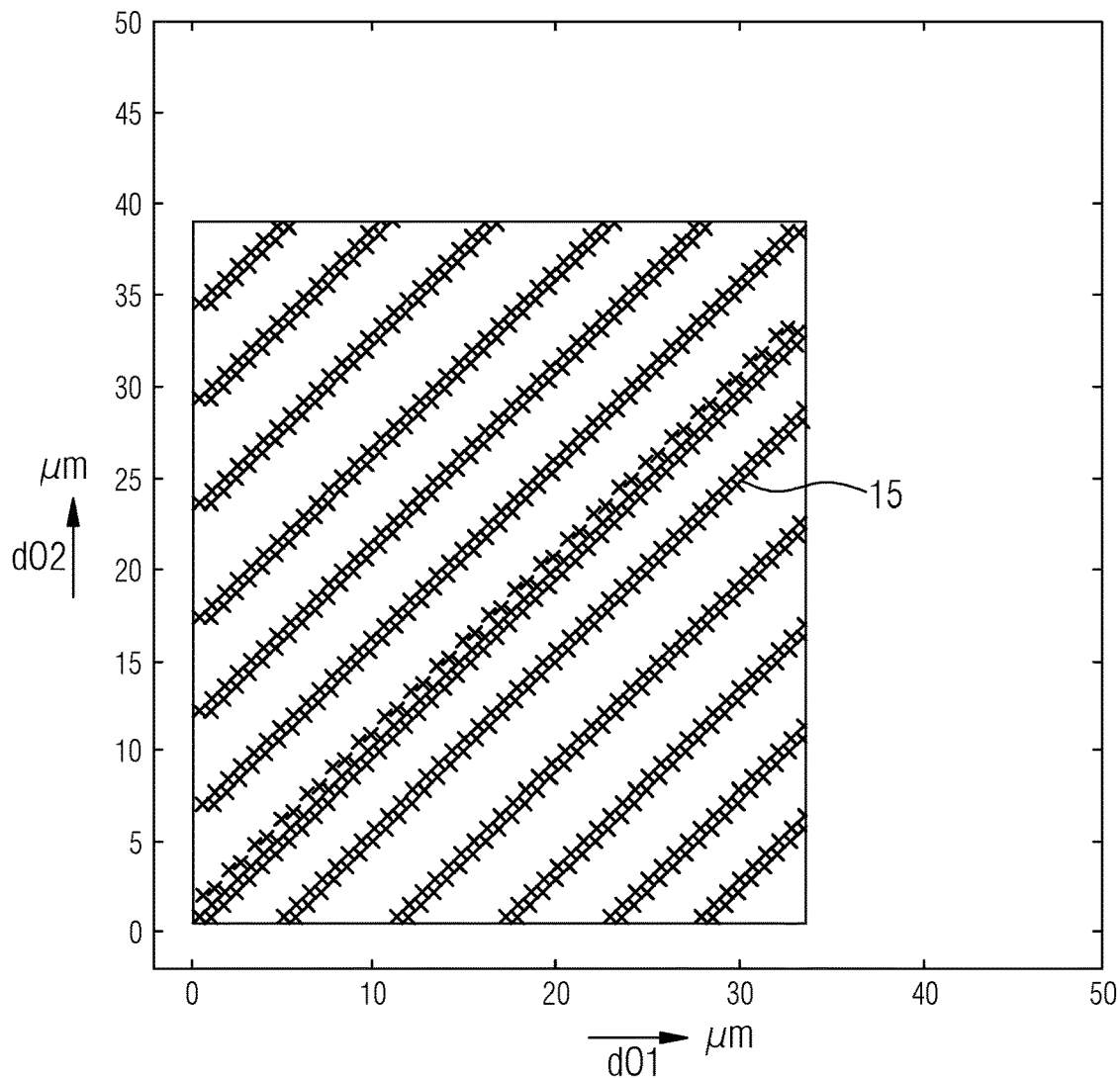

FIGS. 5A to 5C again show a reference example in which, in contrast to the embodiment described on the basis of FIGS. 4A to 4C, for the first average optics spacing AO1=34 µm and the second average optics spacing AO2=39 µm have been selected. This results in the values m2=33.8, m4=4.1, m1=4.1 and m3=25.5 for the factors m1 to m4 in the conditions (i) to (iv).

Thus, the factors differ significantly from a natural number in each case. From FIG. 5C, it can be seen that the fold-back emitter positions 14 in this case are in a highly inhomogeneous arrangement with a pronounced stripe pattern. This results in an inhomogeneous illumination of a target area.

In the exemplary embodiments shown, the emitters 1 and the optical elements 2 are each arranged in a regular rectangular lattice. Deviating from this, however, another arrangement, for example a hexagonal arrangement, can be applied for the emitters and/or the optical elements. Furthermore, the emitters can also be arranged in a hexagonal arrangement and the optical elements in a rectangular arrangement, or vice versa.

A hexagonal arrangement of the emitters 1 would result in FIG. 3A, for example, if the emitters 1 in every second row are arranged offset by half the first average emitter spacing AE1, since for the second average emitter spacing AE2 the relationship applies:

$AE2=\sqrt{3}/2*AE1$.

Figure 6:
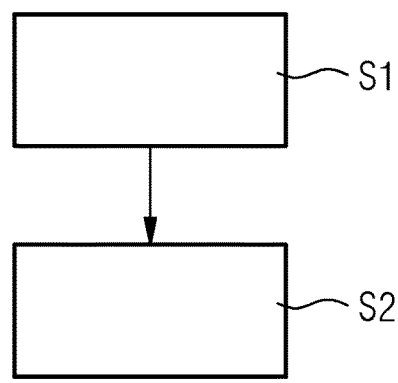
FIG. 6 shows an exemplary embodiment of a method for producing a radiation emitting device.

FIGS. 6A and 6B schematically illustrate a method for producing a radiation emitting device. Here, in a step S1, an assembly is determined with a number and position of emitters 1 and optical elements 2 such that the emitters are arranged along a first emitter direction dE1 at a first average emitter spacing AE1 and along a second emitter direction dE2 extending obliquely or perpendicularly to a first emitter direction dE1 at a second average emitter spacing AE2. The optical elements 2 are arranged along a first optics direction dO1 at a first average optics spacing AO1 and along a second optics direction dO2 extending obliquely or perpendicularly to the first optics direction dO1 at a second average optics spacing AO2.

In particular, this is done in such a way that, in relations (i) to (iv), integer values or at least numbers with a small deviation of no more than 0.05 in amount from the nearest integer are obtained for the factors m1, m2, m3 and m4.

In an embodiment, the number of emitters along the first emitter direction and along the second emitter direction is selected as a prime number in each case, so that the factors m1, m2, m3 and m4, taken by themselves or at least rounded to integers, are co-prime to the number of emitters.

However, all of conditions (i) through (iv) need not necessarily be satisfied. Improved homogeneity of illumination is already achieved if at least one of the above conditions is satisfied, especially in conjunction with one or more of the above conditions (v) to (viii) being satisfied.

Subsequently, the radiation emitting device can be produced in a step S2 according to the previously determined structure.

With the method described, the spacing of the emitters and the spacing of the optical elements can be matched to each other such that homogeneous illumination of a target object, for example a flat surface or a three-dimensional device, such as a human face, is obtained. In particular, unwanted patterns in the illumination caused by interference, for example due to repetitive relative arrangements between optical elements and emitters, can be avoided.

The invention is not limited by the description based on the exemplary embodiments. Rather, the invention encompasses any new feature as well as any combination of features, which in particular includes any combination of features in the patent claims, even if that feature or combination itself is not explicitly specified in the patent claims or the exemplary embodiments.

LIST OF REFERENCE SIGNS 1 emitter
10 emitter array
100 radiation emitting device
15 folded-back emitter position
2 optical element
20 optics array
25 optics assembly
9 target object
AE1 first average emitter spacing
AE2 second average emitter spacing
AO1 first average optics spacing
AO2 second average optics spacing
dE1 first emitter direction
dE2 second emitter direction
dO1 first optics direction
dO2 second optics direction
S1, S2 method step

The invention claimed is:

1. A radiation emitting device with a plurality of emitters and a plurality of optical elements, wherein:
the emitters are arranged along a first emitter direction at a first average emitter spacing AE1 and along a second emitter direction extending obliquely or perpendicularly to the first emitter direction at a second average emitter spacing AE2;
the optical elements are arranged along a first optics direction at a first average optics spacing AO1 and along a second optics direction extending obliquely or perpendicularly to the first optics direction at a second average optics spacing AO2; and
at least one of the following four conditions is satisfied:

(i) $NE1 * AE1 * \cos \Phi = m2 * AO1$, (ii) $NE2 * AE2 * \sin \Phi = m4 * AO1$, (iii) $NE1 * AE1 * \sin \Phi = m1 * AO2$, (iv) $NE2 * AE2 * \cos \Phi = m3 * AO2$, and (v) combinations thereof;
wherein:
NE1 is the number of emitters along the first emitter direction,
NE2 is the number of emitters along the second emitter direction,
$\Phi$ is an angle between the first emitter direction and the first optics direction, wherein the first emitter direction and the first optics direction do not extend in parallel to one another, and
m1, m2, m3, and m4 are factors, respectively, wherein at least two of conditions (i) to (iv) are satisfied and wherein the factors m1, m2, m3 and m4 each differ by at most a deviation fraction from an integer closest to the respective factor, the absolute value of the deviation fraction ranging from 0 to 0.05 inclusive.

2. The radiation emitting device according to claim 1, wherein at least one of the following conditions is satisfied:
(v) the integer closest to the factor m2 is coprime to NE1;
(vi) the integer closest to the factor m4 is coprime to NE2;
(vii) the integer closest to the factor m1 is coprime to NE2;
(viii) the integer closest to the factor m3 is coprime to NE1, and
(ix) combinations thereof.

3. The radiation emitting device of claim 2, wherein at least two of conditions (v) to (viii) are satisfied.

4. A method for producing a radiation emitting device with a plurality of emitters and a plurality of optical elements, wherein the method comprises:
(a) determining a structure with a number and a position of the emitters and the optical elements such that:
the emitters are arranged along a first emitter direction at a first average emitter spacing AE1 and along a second emitter direction extending obliquely or perpendicularly to the first emitter direction at a second average emitter spacing AE2;
said optical elements are arranged along a first optics direction at a first average optics spacing AO1 and along a second optics direction extending obliquely or perpendicularly to said first optics direction at a second average optics spacing AO2; and at least one of the following four conditions is satisfied:

(i) $NE1 * AE1 * \cos \Phi = m2 * AO1$, (ii) $NE2 * AE2 * \sin \Phi = m4 * AO1$, (iii) $NE1 * AE1 * \sin \Phi = m1 * AO2$, (iv) $NE2 * AE2 * \cos \Phi = m3 * AO2$, and (v) combinations thereof;

wherein:
NE1 is the number of emitters along the first emitter direction,
NE2 is the number of emitters along the second emitter direction,
$\Phi$ is an angle between the first emitter direction and the first optics direction, wherein the first emitter direction and the first optics direction do not extend in parallel to one another, and
m1, m2, m3, and m4 are factors, respectively; and (b) forming the radiation emitting device in accordance with the determined structure.

5. A radiation emitting device with a plurality of emitters and a plurality of optical elements, wherein:
the emitters are arranged along a first emitter direction at a first average emitter spacing AE1 and along a second emitter direction extending obliquely or perpendicularly to the first emitter direction at a second average emitter spacing AE2;
the optical elements are arranged along a first optics direction at a first average optics spacing AO1 and along a second optics direction extending obliquely or perpendicularly to the first optics direction at a second average optics spacing AO2; and
at least one of the following four conditions is satisfied:

(i) $NE1 * AE1 * \cos \Phi = m2 * AO1$, (ii) $NE2 * AE2 * \sin \Phi = m4 * AO1$, (iii) $NE1 * AE1 * \sin \Phi = m1 * AO2$, (iv) $NE2 * AE2 * \cos \Phi = m3 * AO2$, and (v) combinations thereof;

wherein:
NE1 is the number of emitters along the first emitter direction,
NE2 is the number of emitters along the second emitter direction,
$\Phi$ is an angle between the first emitter direction and the first optics direction, wherein the first emitter direction and the first optics direction do not extend in parallel to one another, and
m1, m2, m3, and m4 are factors, respectively.

6. The radiation emitting device according to claim 5, wherein at least two of conditions (i) to (iv) are satisfied.

7. The radiation emitting device according to claim 5, wherein NE1 and/or NE2 are prime numbers.

8. The radiation emitting device according to claim 5, wherein NE1=NE2.

9. The radiation emitting device according to claim 5, wherein $\Phi=0$.

10. The radiation emitting device according to claim 5, wherein the emitters are arranged in a rectangular lattice.

11. The radiation emitting device according to any claim 5, wherein the emitters are arranged in a hexagonal lattice.

12. The radiation emitting device according to claim 5, wherein the spacing of adjacent emitters along the first emitter direction differs by at most 20% from the first average emitter spacing.

13. The radiation emitting device according to claim 5, wherein the emitters are surface emitting semiconductor lasers or light emitting diodes.

14. The radiation emitting device according to claim 5, wherein the optical elements are arranged in a contiguous optical assembly.

15. The method of claim 4, wherein a radiation emitting device is produced according to claim 5.

* * * * *